(12) United States Patent
Kiesel et al.

(10) Patent No.: US 7,061,940 B2
(45) Date of Patent: Jun. 13, 2006

(54) METHOD FOR SYNCHRONIZING A PLURALITY OF BUS SYSTEMS, AND HIERARCHICAL MULTIBUS SYSTEM CORRESPONDING THERETO

(75) Inventors: Martin Kiesel, Poxdorf (DE); Guido Seeger, Baiersdorf (DE); Dietmar Wanner, Erlangen (DE); Michael Zeitler, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 981 days.

(21) Appl. No.: 09/855,897

(22) Filed: May 15, 2001

(65) Prior Publication Data

US 2002/0037017 A1 Mar. 28, 2002

(30) Foreign Application Priority Data

Sep. 28, 2000 (DE) ................................. 100 48 191

(51) Int. Cl.
*H04J 3/06* (2006.01)
*H04L 7/06* (2006.01)

(52) U.S. Cl. .................... 370/516; 370/509; 375/364

(58) Field of Classification Search ............... 370/503, 370/509, 516–520; 375/354, 356, 364, 376, 375/327; 710/107, 300
See application file for complete search history.

(56) References Cited

U.S. PATENT DOCUMENTS

| 4,503,490 A | | 3/1985 | Thompson ................... 364/200 |
| 5,680,394 A | * | 10/1997 | Bingham et al. ........... 370/503 |
| 5,988,846 A | | 11/1999 | Flamm et al. ............... 364/137 |
| 6,356,967 B1 | * | 3/2002 | Vaisanen et al. ............ 710/107 |

FOREIGN PATENT DOCUMENTS

| DE | 69113038 | 1/1996 |
| DE | 19818325 | 10/1999 |
| DE | 19830130 | 1/2000 |
| DE | 19933753 | 1/2000 |
| DE | 19932635 | 8/2000 |

* cited by examiner

*Primary Examiner*—Steven HD Nguyen
(74) *Attorney, Agent, or Firm*—Baker Botts L.L.P.

(57) ABSTRACT

Synchronization of a bus master to a bus slave permits the desired hierarchical structuring of buses by virtue of a bus slave on a bus receiving the synchronization information for an associated bus master is disclosed. A phase locked loop is used to filter this clock information and to regenerate missing clock pulses. This clock which is now "sound," is supplied to one or more parallel bus masters of other buses, which generate the corresponding clock information using the necessary messages on the respective bus. This principle is independent of the respective bus system, which means that a plurality of identical buses or else different bus systems can be operated hierarchically in synchronization with one another.

18 Claims, 2 Drawing Sheets

METHOD FOR SYNCHRONIZING A PLURALITY OF BUS SYSTEMS, AND HIERARCHICAL MULTIBUS SYSTEM CORRESPONDING THERETO

FIELD OF THE INVENTION

The present invention relates to synchronizing a plurality of bus systems. In particular, the present invention relates to synchronizing a plurality of bus systems, where each bus system has at least one transmission unit and a reception unit, and where, in each bus system, cyclically transmitted synchronization signals are transmitted to a reception unit by the transmission unit, and also a hierarchical multibus system corresponding thereto.

BACKGROUND OF THE INVENTION

Synchronization methods for bus systems and the corresponding reception units are known. They are used, among other things, in fieldbus systems, e.g. the PROFIBUS, or other bus systems, such as the Ethernet. Fieldbus systems are distributed control systems which usually have a transmission unit (head assembly, bus master) and a multiplicity of reception units (slaves). The individual slave assemblies are usually driven by virtue of the transmission unit transmitting an instruction message to the reception units. Upon receipt of the instruction message, the reception units output to a controlled technical installation nominal values which have been transmitted to them previously by the transmission unit. At the same time, they read in from the controlled technical installation actual values which they subsequently transmit to the transmission unit. The transmission unit then calculates new nominal values which it transmits to the individual reception units, so that the reception units are ready for the next instruction message.

The instruction messages are sent by the transmission unit with equidistant timing. From the instruction messages it is therefore possible to derive synchronization signals which can be used to synchronize the reception units to the transmission unit. For producing relatively large networked systems on the basis of such bus systems or fieldbus systems, it is frequently necessary to synchronize a plurality of separate bus systems. In this context, it is also desirable to combine and hence also to synchronize different bus systems with one another.

In this case, great significance is attached to hierarchical structuring of bus systems, e.g. within the context of a local drive concept, where it is generally necessary for a controller, a plurality of drives and power sections to communicate with one another. Particularly in the field of numerically controlled industrial processing machines, e.g. machine tools and robots, having a plurality of interpolating axes, universal clock synchronization is demanded and may be required to access different bus systems. The latter instance is particularly desirable for increasing the flexibility and scope for use. Thus, there exists a need for an efficient method and system for synchronizing a plurality of bus systems.

SUMMARY OF THE INVENTION

The present invention provides a method and system for synchronizing a plurality of bus systems. The present invention achieves this object by the use of a central clock, in particular a common clock, prescribed for each transmission unit in a bus system, and each transmission unit using this central clock to generate the respective synchronization signals autonomously for cyclic transmission to an associated reception unit.

Such mutual synchronization of two or more transmission units or bus masters permits parallel operation of buses, among other things. The transmission units are fed by a central clock. On the basis of the prescribed clock, each transmission unit generates the appropriate synchronization information using the necessary messages on the respective bus. This principle is independent of the respective bus system, which means that both identical bus systems and different bus systems can be operated in synchronism with one another.

In practice, some latitude in time remains between transmission of the actual values read into the transmission unit and transmission of the nominal values to the reception units, on the one hand, and transmission of the next instruction message, on the other hand. This latitude is generally used for "acyclic" messages. In this context, delays by the acyclic messages may cause individual instruction messages to be sent late. Reception of such instruction messages sent late causes erroneous resynchronization of the reception units. To prevent this, it is known practice to provide a phase regulator for a phase locked loop.

In this case, a reception unit in a bus system supplies the synchronization signals to the phase regulator in a phase locked loop having a clock transmitter, and, upon receipt of the synchronization signals, the phase regulator ascertains instantaneous phase errors and readjusts the clock transmitter such that the clock transmitter outputs a nominal number of clock signals between two synchronization signals. See foreign patent application DE 19932635.5, the disclosure of which is incorporated herewith by reference.

In accordance with the present invention, it has now been found to be particularly advantageous if the nominal number of clock signals which is generated using the aforementioned phase locked loop is prescribed as the central clock for all transmission units in the bus systems. If this nominal number of clock signals is prescribed as the central clock for a transmission unit in another bus system, bus systems can be hierarchically structured in a particularly simple and effective manner.

This permits synchronization of a transmission unit or of a bus master to a reception unit or to a bus slave, and hence the desired hierarchical structuring of buses. A reception unit on a bus receives the synchronization information. A phase locked loop is used to filter this clock information and to regenerate missing clock pulses (e.g. as a result of message destruction on the bus). This clock, which is now "sound", is in turn routed to a transmission unit or to a bus master of another bus, which generates the corresponding clock information using the necessary messages on the respective bus. This principle is in turn independent of the respective bus system, which means that a plurality of identical buses or else different bus systems can be operated hierarchically in synchronization with one another.

In order to achieve a sufficient level of accuracy for the synchronization of a reception unit to the transmission unit of another bus system, the present invention provides for the phase regulator to integrate the instantaneous phase errors to form an integration value, and that the integration value be corrected to form an integration fraction, the integration fraction being less than one.

To permit various bus systems to be operated using different clock periods, the present invention divides the clock before a transmission unit is driven using a central clock. Alternatively, frequency multiplication is effected, in particular within the phase locked loop, before a transmission unit is driven using a central clock.

In accordance with an exemplary embodiment of the present invention, a clock divider is incorporated between the clock feeding the respective transmission unit or the respective bus master and the actual bus master, then the respective bus systems under consideration can also be operated using different bus clock period durations, and can be synchronous as well. Clock division means that only lower frequency clock period durations can be fed into the respective bus master connected downstream.

Since the phase locked loop (PLL) described above is also able to generate higher frequency clock pulses than the clock originally received by the PLL, it is thus also possible to feed higher frequency clock pulses into the respective bus master connected downstream, or the transmission unit.

In addition, in accordance with an exemplary embodiment of the present invention, in order to compensate for delay time effects during synchronization, the respective central clock generated by the phase locked loop is prescribed so that it is advanced by the delay time of a received clock message. The clock instant of a clock message represents the message end, since only after a message has been received completely can it be decoded as such. The clock pulses produced by the PLL are then synchronized with this clock message end. If a clock message is now intended to be sent synchronized with the received clock messages or the PLL, then this can occur so that it is advanced by the delay time of the clock message so that the timing of the clock message end coincides with that of the message end for a received clock message or with that of the clock pulses produced by the PLL. In this way, in hierarchical bus systems, for example, it is possible for the bus master/transmission unit and the bus slave/reception unit to be operated with no phase shift with respect to one another.

Accordingly, for the purposes of hierarchically synchronizing a plurality of bus systems, a plurality of phase locked loops for a plurality of bus systems are advantageously cascaded. In this context, the present invention prevents oscillations in the phase locked loops, the frequency response of each phase locked loop has a gain of less than or equal to unity.

The inventive method of the present invention illustrated above can thus be used to synchronize different bus systems, with clock synchronization also being possible despite different bus systems. This results in a higher degree of flexibility and in an increase in the scope for use with universal clock synchronization as compared with known concepts.

This flexibility is increased further by different, but synchronous, bus clock period durations (e.g. one drive bus with high demands and another bus for a simple peripheral area with low demands in respect of reaction times/bus clock period duration/dynamics, etc). A loss of performance as a result of possible delay time effects for the clock messages can likewise be prevented.

BRIEF DESCRIPTION OF THE DRAWINGS

For a complete understanding of the present invention and the advantages thereof, reference is now made to the following description taken in conjunction with the accompanying drawings in which like reference numbers indicate like features, components and method steps, as wherein.

DETAILED DESCRIPTION OF THE INVENTION

Figure 1:
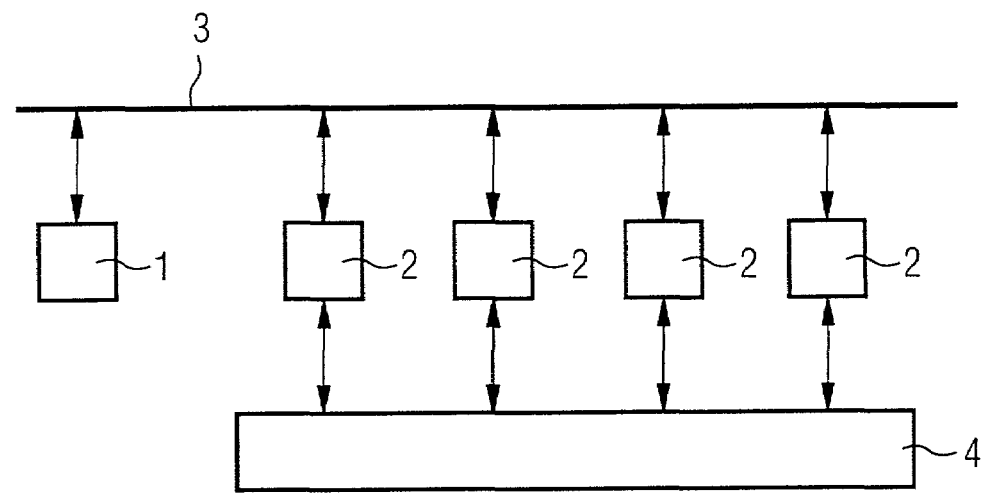
FIG. 1 is a block diagram of a distributed control system.

Now referring to the drawings, FIG. 1 illustrates a distributed control system comprising a transmission unit 1 and reception units 2 which are connected to one another by means of a bus system 3. The transmission unit 1 cyclically transmits messages to the reception units 2, which react appropriately to the messages received. In an exemplary embodiment, the reception units 2 read in input variables from a controlled technical installation or application 4, and emit output variables to the technical installation or application 4. This is indicated in FIG. 1 by the arrows between the reception units 2 and the technical installation/application 4.

In one exemplary embodiment of the present invention, the transmission unit 1 and the reception units 2 communicate on the basis of the following, cyclically executed scheme: First, the transmission unit 1 transmits to the reception units 2 output variables which are intended to be output to the technical installation/application 4. It then transmits an instruction message to the reception units 2. On transmission of the instruction message, the reception units 2 output the output variables to the technical installation 4 and reads in input variables from the technical installation 4. The input variables read in are then requested by the transmission unit 1.

Ideally, the above scheme is executed strictly cyclically and with strictly equidistant timing. In particular, the instruction messages can therefore be used as synchronization signals S, or synchronization signals S can be derived from the instruction messages. The synchronization signals S can then be used to synchronize the reception units 2 to the transmission unit 1.

Figure 2:
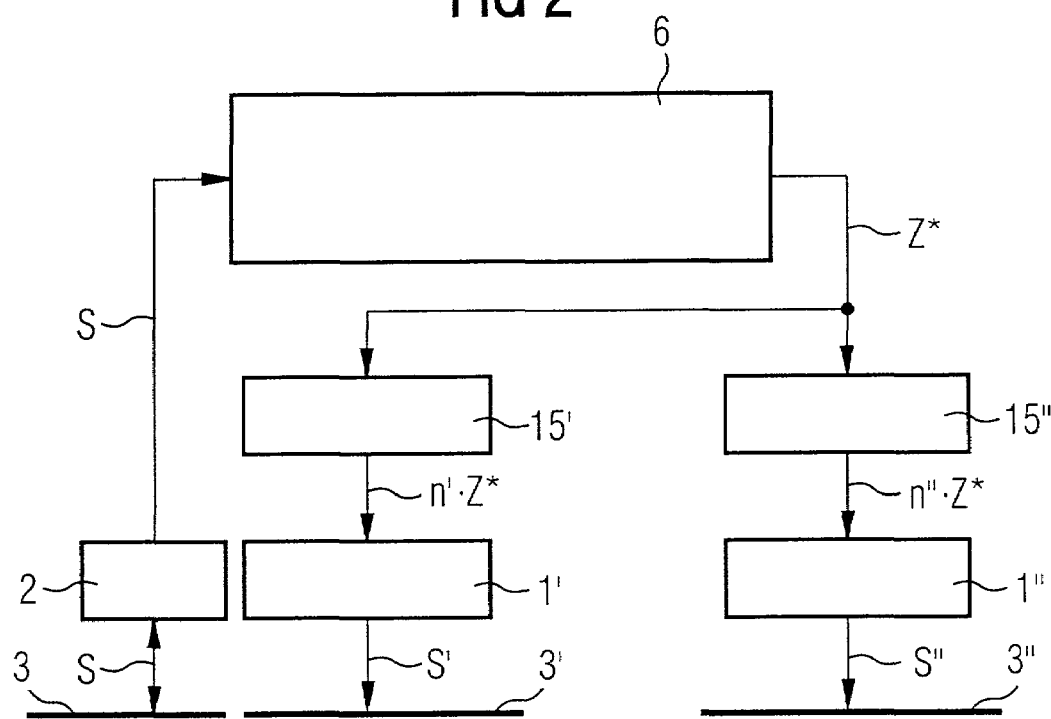
FIG. 2 is a block diagram of two synchronized bus systems to illustrate the topological circumstances.

The illustration shown in FIG. 2 shows the topological arrangement of three different bus systems 3, 3' and 3" which are advantageously interconnected and are synchronized to one another on the basis of the method of the present invention. While the bus 3 is shown having a connected reception unit/slave 2 which receives from the bus 3 synchronization signals "S" from a transmission unit/bus master (not shown), the second bus 3' has a transmission unit/bus master 1' shown for it which sends synchronization signals S' to the second bus 3'. A transmission unit/bus master 1" does the same for the third bus 3'.

Accordingly, this relates to the situation where bus systems are hierarchically structured in accordance with the present invention. Without any synchronization the respective synchronization signals S, S' and S" may have very different period durations.

For the purposes of synchronization, the transmission units/bus masters 1' and 1" of bus 3' and 3" are now synchronized to the clock of the reception unit/slave 2 of bus 3. To this end, a phase locked loop 6 is used to generate, from the synchronization signal S, a central clock Z* which is applied to the two bus systems 3' and 3".

This central clock Z* can be used directly or via optional respective frequency dividers 15', 15" to drive the respective transmission units/bus masters 1', 1" of the bus systems 3', 3". The frequency dividers 15', 15" can have different division ratios n', n", so that the two buses 3', 3" can also be operated in synchronization using different bus period durations. Besides clock division, frequency multiplication (n', n">1) is also suitable, these being possible in particular using the phase locked loop (PLL), explained below. This also permits higher frequency clock pulses to be fed into the respective transmission unit/bus master connected downstream.

Figure 3:
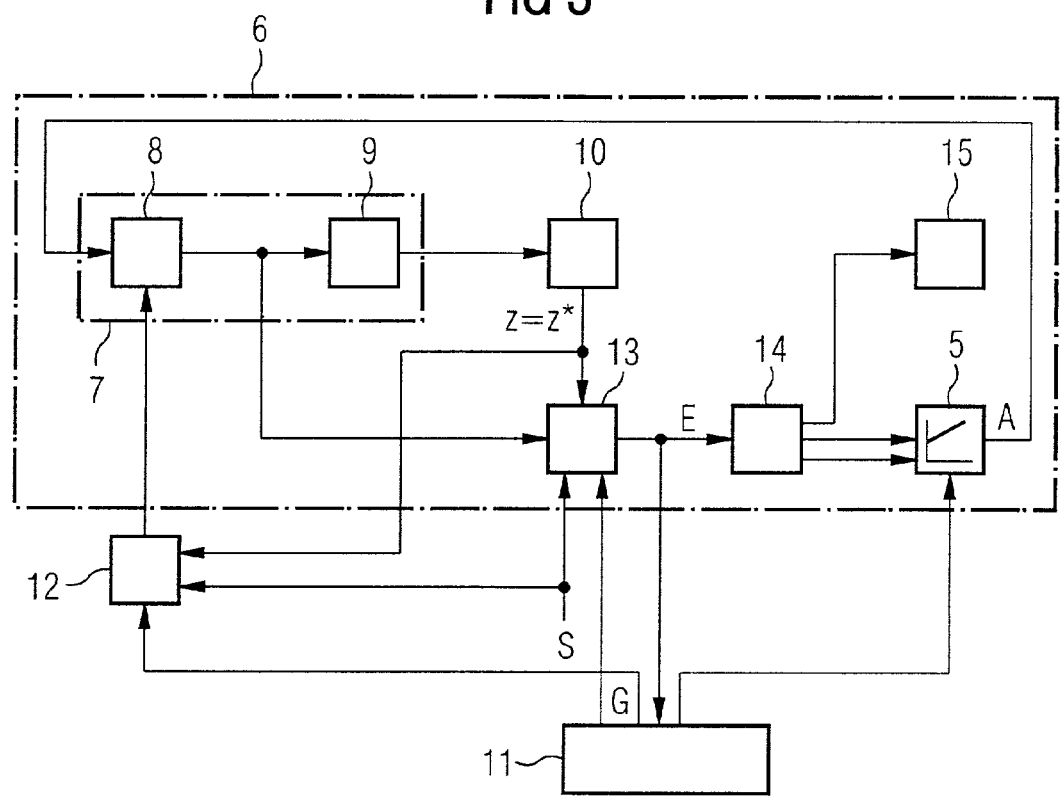
FIG. 3 is a block diagram of a phase locked loop.

On the basis of FIG. 3, the synchronization signals received by a reception unit/slave 2 are supplied via a bus connection module to a phase regulator 5 in a phase locked loop 6. The phase locked loop 6 has a clock transmitter 7. Within the clock transmitter 7, a clock generator 8 produces primary clock signals which are supplied to a frequency divider 9. At the output, the frequency divider 9 outputs the divided primary clock signals in the form of clock signals. The clock signals are supplied to a clock signal counter 10.

With ideal regulation of the clock generator 8, the clock transmitter 7 outputs exactly one nominal number Z* of clock signals between two synchronization signals S. However, the clock transmitter 7 generally outputs a number Z of clock signals which differs from the nominal number Z*. The phase regulator 5, therefore, ascertains instantaneous phase errors E upon receipt of the synchronization signals, and then readjusts the clock transmitter 7 such that it outputs the nominal number Z* of clock signals between two synchronization signals S. This is done as follows: Before the start of synchronization, that is to say before the first instantaneous phase error E is ascertained, a control unit 11 first prescribes a start signal for a driving unit 12. This driving unit 12 then drives the clock generator 8 in the clock transmitter 7. When the clock signal counter 10 has counted the nominal number Z* of clock signals, the clock signal counter 10 transmits a signal to the driving unit 12. The driving unit then stops the clock generator 8 again. The phase locked loop 6 has thus been "biased." Upon receipt of the next synchronization signal, which is likewise transmitted to the driving unit 12, the driving unit 12 then starts the clock generator 8 again. This increments the clock signal counter 10 again.

The reaching of the nominal number Z* and the arrival of the next synchronization signal S are reported to a primary clock counter 13. Upon the arrival of the first of these two signals, the primary clock counter 13 is started; upon the arrival of the second of the two signals, it is stopped. The count (which has an arithmetic sign) of the primary clock counter 13 is thus a direct measure of the error between the clocking of the clock transmitter 7 and the periodicity of the synchronization signals S.

Upon receipt of the first synchronization signal S, after the clock transmitter 7 has been restarted, the count of the primary clock counter 13 is transmitted to the control unit 11. The control unit uses it to calculate a correction value for driving the clock generator 8, and prescribes this correction value directly to the phase regulator 5. This at least substantially corrects the instantaneous phase error E detected during the first synchronization cycle.

In the further synchronization cycles, the primary clock counter 13 is always controlled on the basis of the synchronization signal S and the reaching of the nominal number Z*. The primary clock counter 13 is started upon the arrival of the first of these two signals and is stopped upon the arrival of the second of these two signals. The count of the primary clock counter 13 is supplied to a comparator 14.

The count on the primary clock counter 13 is compared with a maximum error. If the count exceeds the maximum error, a timeout counter 15 is incremented. In this case, no error signal is output to the phase regulator 5. The phase regulator 5 maintains its previous output signal.

Figure 4:
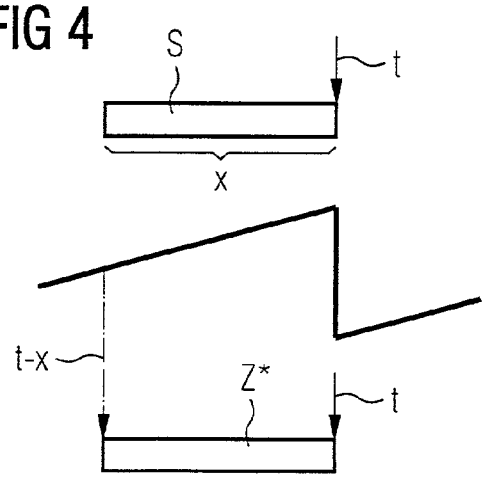
FIG. 4 illustrates a timing diagram for delay time compensation.

The primary clock counter 13 is usually started and stopped whenever a synchronization signal S is transmitted. However, it is also possible for a validity signal G to be additionally transmitted to the phase locked loop 6 by the control unit 11. In this case, the primary clock counter 13 is started and stopped only if the validity signal G is present. It is also possible to start and to evaluate the primary clock counter 13 with a phase offset with respect to the synchronization signal S. This is advantageous for compensating for delay time effects as described above (see FIG. 4 also).

It is advantageous in the design of hierarchical bus systems, as shown in FIG. 2, to change the control parameters of the phase locked loop 6 such that the frequency response of the PLL 6 has, if possible, no gain or a gain of less than 1, but at the outside only low gains of greater than 1. This is necessary so that, when bus systems are hierarchically structured, the overall frequency response of a plurality of series-connected PLLs 6 does not have a pronounced resonant frequency at which the PLLs 6 could easily be excited into oscillation.

On the basis of FIG. 2, it is also possible to operate the two bus systems 3', 3" in parallel without hierarchical structuring, by virtue of output clock signals being produced rigidly without synchronization to a bus reception unit 2. The PLL 6 then functions as an autonomous clock generator for producing a common central clock Z*.

If the clock message is to be sent in synchronization with the received clock messages or the PLL 6, this can occur so that it is advanced by the delay time of the clock message. This correlation is demonstrated in the illustration shown in FIG. 4.

The illustration shows a received clock message S which has been fully received at the clock instant t. Not until this instant can the clock message be decoded. So that the timing of the clock message end for a central clock Z* coincides with that of the message end for a received clock message S or with that of the clock pulses produced by the PLL 6. The clock message for the central clock Z* is now sent so that it is advanced by a defined time x, advantageously the delay time of the received clock message. This prevents delay time effects when synchronizing different bus systems, and in the case of hierarchical bus systems, it is possible for transmission units/bus masters and reception unit/bus slave to be operated in synchronization with one another without phase shifting.

Although the present invention has been described in detail of reference to specific exemplary embodiments thereof, various modifications, alterations and adaptation may be made by those skilled in the art without departing for the spirit and scope of the invention. It is intended that the invention be limited only be the appended claims.

The invention claimed is:

1. A method for synchronizing a plurality of bus systems, said method comprising:
    transmitting synchronization signals from a transmission unit to an associated reception unit said associated reception unit supplying synchronization signals to a phase regulator in a phase locked loop having a clock transmitter, where each bus system has at least one transmission unit and at least one associated reception unit; said transmission unit using a central clock to generate said synchronization signals autonomously for cyclic transmission to said associated reception unit, wherein said central clock is prescribed for each of said transmission units in a bus system;
    upon receipt of said synchronization signals, said phase regulator ascertains instantaneous phase errors and readjusts the clock transmitter such that said clock transmitter outputs a nominal number of clock signals between two synchronization signals, wherein said nominal number of clock signals is prescribed as said central clock for a transmission unit in second another bus system; and transmitting data between said synchronized transmission unit and associated reception unit.

2. The method of claim 1, wherein said reception unit in a bus system supplies the synchronization signals to a phase regulator in a phase locked loop having a clock transmitter, and upon receipt of said synchronization signals said phase regulator ascertains instantaneous phase errors and readjusts the clock transmitter such that said clock transmitter outputs a nominal number of clock signals between two synchronization signals, wherein said nominal number of clock signals is prescribed for all transmission units in said bus systems as said central clock.

3. The method of claim 1 or 2, wherein said phase regulator integrates the instantaneous phase errors to form an integration value, and wherein said integration value is corrected to form an integration fraction, with said integration fraction being less than one.

4. The method of claim 1, wherein a clock division is effected before said transmission unit is driven using a central clock.

5. The method of claim 1, wherein frequency multiplication is effected within the phase locked loop before a transmission unit is driven using a central clock.

6. The method of claim 1 or 2, wherein a message end of a clock message represents a respective clock instant, wherein said central clock generated by said phase locked loop is prescribed so that it is advanced by a delay time of a received clock message.

7. The method of claim 1 or 2, wherein a plurality of phase locked loops in a plurality of bus systems are cascaded.

8. The method of claim 7, wherein said frequency response of each of said phase locked loops has a gain of less than or equal to unity.

9. The method of claim 1, wherein said central clock is a common clock for all bus systems.

10. A method for synchronizing a plurality of bus systems, said method comprising:

transmitting synchronization signals from a transmission unit to an associated reception unit, where each bus system has at least one transmission unit and at least one associated reception unit; and said transmission unit using a central clock to generate said synchronization signals autonomously for cyclic transmission to said associated reception unit, wherein said central clock is prescribed for each of said transmission units in a bus system;

wherein said reception unit in a bus system supplies the synchronization signals to a phase regulator in a phase locked loop having a clock transmitter, and upon receipt of said synchronization signals said phase regulator ascertains instantaneous phase errors and readjusts the clock transmitter such that said clock transmitter outputs a nominal number of clock signals between two synchronization signals, wherein said nominal number of clock signals is prescribed for all transmission units in said bus systems as said central clock.

11. The method of claim 10, wherein said phase regulator integrates the instantaneous phase errors to form an integration value, and wherein said integration value is corrected to form an integration fraction, with said integration fraction being less than one.

12. The method of claim 10, wherein a clock division is effected before said transmission unit is driven using a central clock.

13. The method of claim 10, wherein frequency multiplication is effected within the phase locked loop before a transmission unit is driven using a central clock.

14. The method of claim 10, wherein a message end of a clock message represents a respective clock instant, wherein said central clock generated by said phase locked loop is prescribed so that it is advanced by a delay time of a received clock message.

15. The method of claim 10, wherein a plurality of phase locked loops in a plurality of bus systems are cascaded.

16. The method of claim 15, wherein said frequency response of each of said phase locked loops has a gain of less than or equal to unity.

17. A method for synchronizing a plurality of bus systems, said method comprising:

transmitting synchronization signals from a transmission unit to an associated reception unit, where each bus system has at least one transmission unit and at least one associated reception unit;

said transmission unit using a central clock to generate said synchronization signals autonomously for cyclic transmission to said associated reception unit, wherein said central clock is prescribed for each of said transmission units in a bus system; and a reception unit in a first bus system supplying synchronization signals to a phase regulator in a phase locked loop having a clock transmitter; upon receipt of said synchronization signals, said phase regulator ascertains instantaneous phase errors and readjusts the clock transmitter such that said clock transmitter outputs a nominal number of clock signals between two synchronization signals, wherein said nominal number of clock signals is prescribed as said central clock for a transmission unit in second another bus system.

18. The method of claim 17, wherein said phase regulator integrates the instantaneous phase errors to form an integration value, and wherein said integration value is corrected to form an integration fraction, with said integration fraction being less than one.

* * * * *